（12） United States Patent
Donovan et al.

(10) Patent No.: US 10,411,676 B2
(45) Date of Patent: Sep. 10, 2019

(54) VOLTAGE COMPARATOR

(71) Applicant: FIRECOMMS LIMITED, Cork (IE)

(72) Inventors: Colm Donovan, Leap (IE); Ciaran Cahill, Blarney (IE); Patrick Murphy, Cork (IE)

(73) Assignee: FIRECOMMS LIMITED, Cork (IE)

( * ) Notice: Subject to any disclaimer, the term of this patent is extended or adjusted under 35 U.S.C. 154(b) by 0 days.

(21) Appl. No.: 15/760,137

(22) PCT Filed: Sep. 13, 2016

(86) PCT No.: PCT/EP2016/071534
§ 371 (c)(1),
(2) Date: Mar. 14, 2018

(87) PCT Pub. No.: WO2017/046073
PCT Pub. Date: Mar. 23, 2017

(65) Prior Publication Data
US 2018/0254771 A1    Sep. 6, 2018

(30) Foreign Application Priority Data

Sep. 15, 2015  (EP) .................................... 15185221

(51) Int. Cl.
| | | |
|---|---|---|
| *H03K 17/08* | (2006.01) | |
| *H03K 3/0233* | (2006.01) | |
| *H03K 5/24* | (2006.01) | |
| *H03F 3/16* | (2006.01) | |

(52) U.S. Cl.
CPC ........... *H03K 3/02337* (2013.01); *H03F 3/16* (2013.01); *H03K 5/2481* (2013.01); *H03F 2200/135* (2013.01)

(58) Field of Classification Search
CPC ............. H03K 3/02337; H03K 5/2472; H03K 5/2481; H03F 2200/186; H03F 2200/135; H03F 3/16
See application file for complete search history.

(56) References Cited

U.S. PATENT DOCUMENTS

| | | |
|---|---|---|
| 4,874,969 A | 10/1989 | Meadows |
| 5,369,319 A | 11/1994 | Good et al. |
| 5,656,957 A * | 8/1997 | Marlow ............. H03K 3/02337 327/205 |
| 6,229,350 B1 | 5/2001 | Ricon-Mora |
| 6,320,429 B1 | 11/2001 | Yano |
| 6,970,022 B1 | 11/2005 | Miller |

(Continued)

OTHER PUBLICATIONS

International Search Report issued in PCT/EP2016/071534; dated Nov. 29, 2016.

*Primary Examiner* — Hai L Nguyen
(74) *Attorney, Agent, or Firm* — Studebaker & Brackett PC

(57) ABSTRACT

A voltage comparator (1) has a high switching speed and simplicity of design. It minimizes pulse-width distortion of input digital signals when functioning as a digital input buffer in high speed communications applications. In addition it provides a simple hysteresis circuit (31) that is easily tuneable with a reference current. The hysteresis circuit (31) is dependent on a reference current. This current may be chosen to have a proportionality to temperature, supply, or another selectable parameter, and may be programmable, in order to create the desired hysteresis performance.

9 Claims, 2 Drawing Sheets

(56) References Cited

U.S. PATENT DOCUMENTS

| | | | |
|---|---|---|---|
| 7,268,604 B2 * | 9/2007 | Koo | H03K 3/3565 |
| | | | 327/206 |
| 7,576,572 B2 | 8/2009 | Ball | |
| 8,203,370 B2 | 6/2012 | Yan et al. | |
| 2008/0265986 A1 | 10/2008 | Salcido et al. | |

* cited by examiner

VOLTAGE COMPARATOR

FIELD OF THE INVENTION

The invention relates to a voltage comparator, especially for high speed digital communication.

Voltage comparators are used to compare the voltages of two signals and give a digital output. For example they can be used to detect an input digital signal high or low value by comparing the input signal to a reference signal. In communications applications such a function would require very fast detection of signals so as to minimize any pulse width distortion introduced to the signal.

PRIOR ART DISCUSSION

In a normal electrical environment it is common to expect an input signal to contain large elements of noise. An undesired behaviour of comparators is false detection of a change in the input due to noise as the input signal approaches the comparator threshold. A prior technique for avoiding such undesired behaviour is the introduction of hysteresis, such as described in U.S. Pat. No. 5,369,319.

U.S. Pat. No. 6,320,429 describes an amplifier with multiple gain stages.

U.S. Pat. No. 4,874,969 describes a high speed CMOS comparator with hysteresis.

In the prior art diode loads are used. In the case of large input signals one of the input transistors will completely turn off and this results in zero bias current flowing through the diode load. If this happens, then when the input changes and the device tries to turn on there is first a delay as the diode load must now first 'charge up' its parasitic capacitances.

In many applications the input signals are not large enough to cause this to happen. In many other types of applications this delay is completely negligible. However in sensitive communications systems this delay results in pulse-width-distortion in a communication system.

Usually in high-speed communication systems this problem is avoided by using low-voltage fully differential inputs, for example the LVDS (Low Voltage Differential Signalling) standard, with which any charging delays are perfectly symmetrical and thus fully cancel. However in the case of requiring a single-ended high-speed system this is a significant problem.

The invention is directed towards providing a voltage comparator which has a high switching speed and/or a simple design.

SUMMARY OF THE INVENTION

According to the invention, there is provided a voltage comparator comprising a first stage amplifier comprising a current source connected to the sources of first and second input switches and first and second load switches. A final stage amplifier, which may be the second or a subsequent stage amplifier, comprises first and second input switches and first and second load switches.

In the first stage amplifier:
  the first input switch is linked to a voltage input,
  the second input switch is linked to a voltage input, and
  the first load switch is biased by the first input switch, and
    the second load switch is biased by the second input switch.

The first stage amplifier load switches are configured as diodes, with their gates connected to their drains, and current sources are coupled to the drains of the first stage amplifier input switches, each of which has a drain feed into the gate or drain of the first stage amplifier load switches.

The drain connection of the first stage amplifier input switches connects to a terminal of complementary switches of a hysteresis circuit, in which said complementary switches connect together at another terminal with a current sources to vary current flowing in the first stage amplifier load switches in response to the state of the output with the purpose of creating a hysteresis voltage.

In one embodiment, the final stage amplifier is biased by either the first stage amplifier or an intermediate stage amplifier between said first stage amplifier and final stage amplifier.

In one embodiment, the comparator comprises two or more intermediate stage amplifiers.

In one embodiment, an intermediate stage amplifier further comprises a bias current source coupled to its load switches.

In one embodiment, the gate and drain of the first stage amplifier load switches are connected to equal current sources.

In one embodiment, each switch is a PMOS device or an NMOS device.

In one embodiment, the hysteresis circuit is biased by a current with a proportionality to an operating condition in order to control the behaviour of the hysteresis.

In one embodiment, the operating condition is temperature.

In one embodiment, the hysteresis circuit is programmed for different operating environments or conditions.

Additional Statements

According to the invention, there is provided a voltage comparator comprising a first stage amplifier linked with a second stage amplifier, wherein switches of the first stage amplifier are linked to bias switches of both stages.

In one embodiment, the first stage amplifier comprises:
  a switch (Mp1) linked to a voltage input,
  a switch (Mp2) linked to a voltage reference, and
  a switch (Mn1) biased by Mp1 and a switch Mn2 biased by Mp2,
wherein switches Mp1 and Mp2 also bias switches (Mn3, Mn4) of the second stage.

In one embodiment, a current source is coupled to the sources of the input pair of switches (MP1/2), each of whose drains feed into the gate/drain of NMOS diode connected loads (MN1/2).

In one embodiment, the gate/drain of MN1/2 is connected to equal current sources.

In one embodiment, the gate/drain connection of MN1/2 connects to separate complementary switches, and said switches connect together at the drain of a current source whose purpose is to unbalance the equal current that would otherwise flow in MN1/2 from sources I1/2 with the purpose of creating a hysteresis voltage.

In one embodiment, each switch component is a PMOS device or an NMOS device.

In one embodiment, the gates of the diode connected loads are coupled to the inputs of a second stage amplifier and provide a means of setting a bias current in the second stage amplifier.

In one embodiment, the hysteresis current has proportionality to an operating condition in order to control the behaviour of the hysteresis.

In one embodiment, the hysteresis current is programmed for different operating environments or conditions.

DETAILED DESCRIPTION OF THE INVENTION

Brief Description of the Drawings

The invention will be more clearly understood from the following description of some embodiments thereof, given by way of example only with reference to the accompanying drawings in which:—

DESCRIPTION OF THE EMBODIMENTS

A voltage comparator has a high switching speed and simplicity of design. It minimizes pulse-width distortion of input digital signals when functioning as a digital input buffer in high speed communications applications. In addition it provides a simple hysteresis circuit that is easily tuneable with a reference current. The hysteresis circuit is dependent on a reference current. This current may be chosen to have a proportionality to temperature, supply, or another selectable parameter, and may be programmable, in order to create the desired hysteresis performance.

Figure 1:
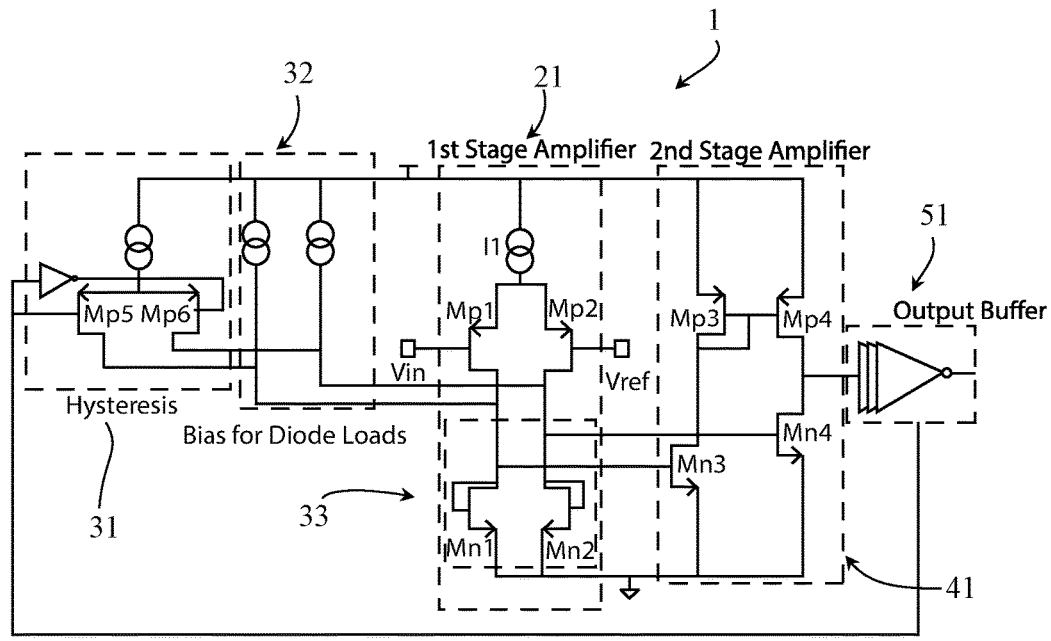
FIG. 1 is a circuit diagram showing a voltage comparator of the invention.

Referring to FIG. 1, an input first stage amplifier 21 is coupled to a second and final stage amplifier 41, whose output connects to a buffer 51, or to some other circuitry in other embodiments. The input amplifier 21 has load diodes 33 biased with a minimum current from a bias current circuit 32. Also, there are input switches Mp1 and Mp2, the gates of which are linked to $V_{in}$ and $V_{ref}$ respectively. A hysteresis circuit 31 contains complementary switches Mp5, Mp6, and modulates a current on to one or other of the load diodes 33 depending on the state of the output.

The term "switch" is used broadly to cover any device which has an output controllable by an input, not necessarily an ON or OFF output.

In the case of Mp1 turning completely off and conducting no current, a diode-connected MOS device Mn1 will remain biased slightly on by the bias current circuit 32. This bias current has three benefits:

(a) The final stage amplifier 41 bias currents have a well-defined minimum.
(b) The voltage excursion on the drains of the first stage amplifier 21 input switches Mp1 and Mp2, and correspondingly the gates of its load switches Mn1/Mn2 are minimized
(c) The bias currents to Mn1 and Mn2 provide a simple means to implement a well-controlled hysteresis through the unbalancing of the bias currents.

The benefit of (a) is that the second stage amplifier 41 bandwidth is more stable than the case where the bias current falls to near zero. This results in minimization of pulse-width distortion when this circuit is used as an input-buffer in communications systems.

The effect of (b) is to reduce pulse-width distortion when the circuit is used as an input buffer in communications systems. This is because the voltage excursions on the drains of Mp1/2 are minimized. The effect of this is to have a relatively constant response with respect to the input voltage swing magnitude in a communications system. This results in minimization of pulse-width distortion.

As mentioned in (c), the implementation of hysteresis may be done through the unbalancing of the bias currents to the load diodes 33. This is an extremely advantageous method of implementing hysteresis because there is a negligible extra parasitic loading of the sensitive drain nodes of Mp1/Mp2, and thus improving speed over prior methods of implementing hysteresis.

This hysteresis current may be controlled to have proportionality to an operating condition such as temperature in order to either stabilize the hysteresis over temperature, or to increase hysteresis over temperature to compensate for increasing noise. The hysteresis circuit may also be programmed to increase in noisy environments, at the expense of the inherent increase in pulse-width distortion associated with the use of hysteresis due to the change in the trip threshold.

It will be appreciated that the bias components 32 apply a pre-bias to Mn1 and Mn3 and also Mn2 and Mn4 for faster turn-on.

Advantageously, the first and second stages 21 and 41 are biased together. This achieves improved speed and a low pulse width distortion, while minimising circuit complexity and silicon area required.

The hysteresis function 31 sends unequal currents to Mn1 and Mn2. This is akin to modulating an additional current onto each.

In more detail, the voltage on Vin is a varying logic signal level voltage. Vref is a bandgap reference voltage of 1.2V. The current source tied to the sources of Mp1 and Mp2 is a PMOS current mirror with its gate biased so that it supplies 200 uA.

The current sources 32 are two PMOS current mirrors with their gates biased to supply 10 μA. The hysteresis current source consists of a PMOS current mirror with its gate biased so that it supplies 20 μA. The PMOS devices Mp5 and Mp6 are configured to act as complementary switches.

It should be noted that the gate of Mn3 is biased by Mn1 and the gate of Mn4 is biased by Mn2. Neglecting the bias currents of 31 and 32 for the moment, the devices Mn1/Mn2 may be biased by between zero and 200 uA depending on the input voltages to Mp1 and Mp2. If the devices Mn3 and Mn4 are chosen to be equal to the devices Mn1 and Mn2 then a copy of the Mn1 and Mn2 currents will flow in Mn3 and Mn4 when the input conditions allow it. By recognizing this, a designer can carefully chose to ratio the size of Mn3 and Mn4 relative to Mn1 and Mn2 in order to carefully control the currents, and therefore bandwidths or speeds, of the amplifier of Mn3 and Mn4 & Mp3 and Mp4. It should also be noted that the ratio between Mn3 and Mn1 need not be the same ratio as between Mn4 and Mn2. Similarly the ratio between Mp4 and Mp3 need not be equal, however it would be preferred that the ratio between Mn4 and Mn3 is the same as the ratio between Mp4 and Mp3. This allows for minimal pulse-width distortion while at the same time maximising power efficiency.

It is important to note that neglecting the current sources of 31 and 32 means the bias currents may fall to zero. This has the same drawbacks of allowing the voltage on Mn1/2 to fall to zero. Namely it causes a delay in the turn on of the devices, contributing to pulse-width distortion. However by including the biasing currents of 32 it is ensured that there is always a minimum well controlled bias current in the amplifier of Mn3 and Mn4 and Mp3 and Mp4.

It would also be trivial for a designer to choose the current sources of 32 to be unequal in order to create different minimum bias currents for Mn3/4 and Mp3/4. This imbalance of currents would change the trip point away from the point where Vref equals Vin, but the circuit would otherwise be functional.

Figure 2:
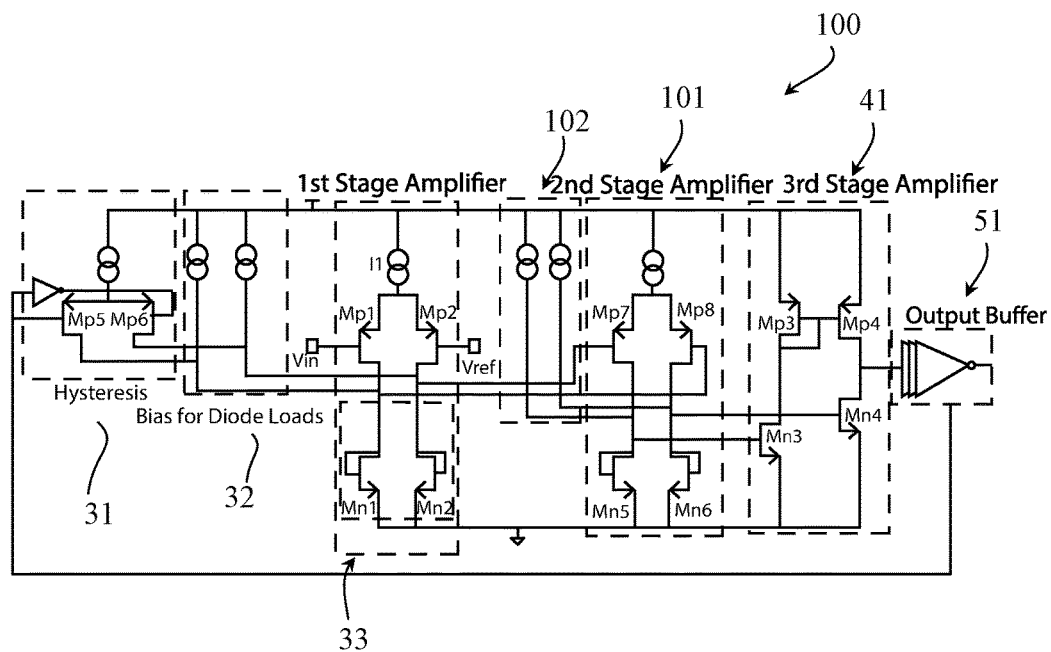
FIGS. 2 and 3 are diagrams showing alternative circuits.

FIG. 2 shows an additional, intermediate, stage, 101, which is similar to the first stage amplifier 33. Extra intermediate gain stages are also possible. This demonstrates that extra gain stages similar in architecture to the first stage may be added. This may be especially beneficial in the case of very small input signals at the input terminals, or for example in the case of LVDS signals used at the input terminals. In this situation more gain may be required than is possible with the two stages shown in FIG. 1. The extra stages may or may not also have a bias current for their diode loads, but a preferred embodiment would include the bias currents. Extra stages will not need any extra hysteresis—hysteresis on the $1^{st}$ stage is sufficient.

Figure 3:
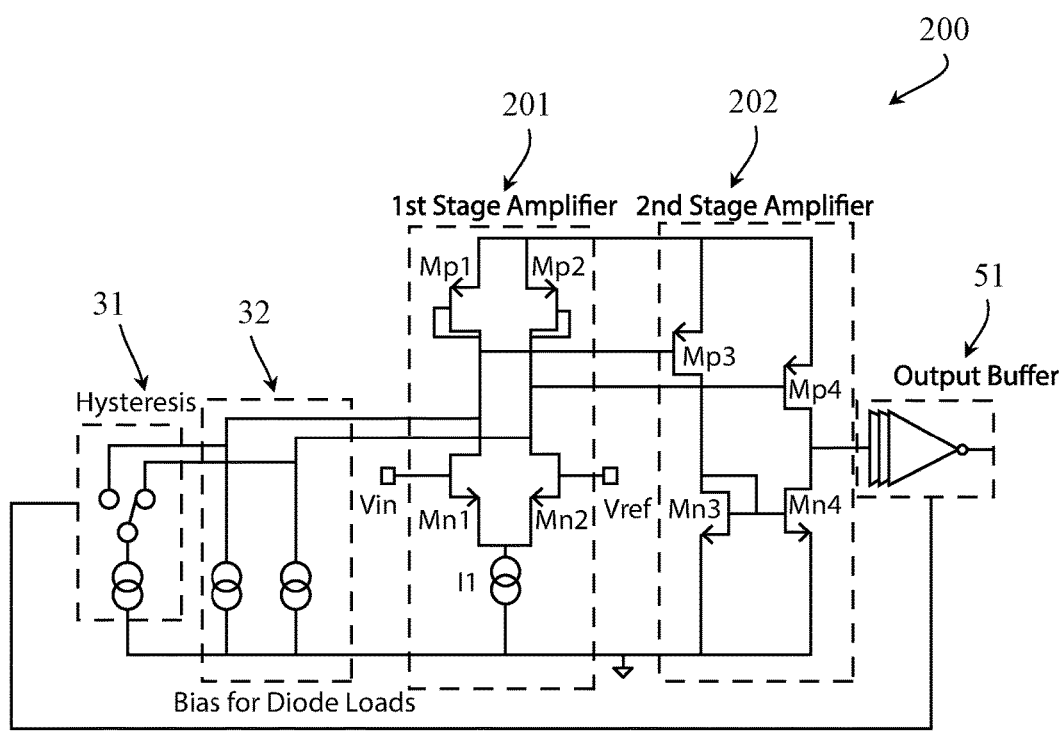

FIG. 3 shows a circuit 200, again with like parts indicated by the same reference numerals, in which an NMOS input stage 201 is used rather than a PMOS stage. This would be advantageous in the case of the input voltages Vin and Vref being voltages that may otherwise turn off the PMOS inputs of FIG. 1. Thus the embodiment of FIG. 3 allows for a different range of input voltages to that of the embodiment of FIG. 1.

The invention is not limited to the embodiments described but may be varied in construction and detail.

The invention claimed is:

1. A voltage comparator comprising first and second voltage inputs and an output, and comprising a first stage amplifier comprising a first stage amplifier current source connected to the sources of first and second input switches and first and second load switches, and a final stage amplifier comprising first and second input switches and first and second load switches and being linked to an output buffer providing the output, wherein in said first stage amplifier:

the first input switch is linked to the first voltage input, and the second input switch is linked to the second voltage input, and the first load switch is biased by the first input switch, and the second load switch is biased by the second input switch, and wherein the first stage amplifier load switches are configured as diodes, with their gates connected to their drains, wherein current sources are coupled to the drains of the first stage amplifier input switches, each of which has a drain feed into the gate or drain of the first stage amplifier load switches, and wherein the drain connection of the first stage amplifier input switches connects to a terminal of hysteresis circuit switches of a hysteresis circuit, in which said hysteresis circuit switches connect together at another terminal with a hysteresis circuit current source, to vary current flowing in the first stage amplifier load switches in response to a state of the output with the purpose of creating a hysteresis voltage and in which said hysteresis circuit switches are configured to act as complementary switches.

2. The voltage comparator as claimed in claim 1, wherein the final stage amplifier is biased by either the first stage amplifier or an intermediate stage amplifier between said first stage amplifier and said final stage amplifier.

3. The voltage comparator as claimed in claim 1, wherein the final stage amplifier is biased by either the first stage amplifier or an intermediate stage amplifier between said first stage amplifier and final stage amplifier; and wherein the voltage comparator comprises two or more intermediate stage amplifiers.

4. The voltage comparator as claimed in claim 1, wherein the final stage amplifier is biased by either the first stage amplifier or an intermediate stage amplifier between said first stage amplifier and said final stage amplifier; and in which the intermediate stage amplifier further comprises a bias current source coupled to its load switches.

5. The voltage comparator as claimed in claim 1, wherein the gate and drain of the first stage amplifier load switches are connected to equal current sources.

6. The voltage comparator as claimed in claim 1, wherein each switch is a PMOS device or an NMOS device.

7. The voltage comparator as claimed in claim 1, wherein the hysteresis circuit is biased by a current with a proportionality to an operating condition in order to control the behaviour of the hysteresis.

8. The voltage comparator as claimed in claim 1, wherein the hysteresis circuit is biased by a current with a proportionality to an operating condition in order to control the behaviour of the hysteresis; and in which the operation condition is temperature.

9. The voltage comparator as claimed in claim 1, wherein the hysteresis current is programmed for different operating environments or conditions.

* * * * *